(12) United States Patent
Horikoshi

(10) Patent No.: US 8,778,569 B2
(45) Date of Patent: Jul. 15, 2014

(54) PELLICLE AND A METHOD FOR MAKING THE SAME

(75) Inventor: Jun Horikoshi, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 181 days.

(21) Appl. No.: 12/923,765

(22) Filed: Oct. 7, 2010

(65) Prior Publication Data

US 2011/0104420 A1    May 5, 2011

(30) Foreign Application Priority Data

Oct. 30, 2009    (JP) ................ 2009-250566

(51) Int. Cl.
*G03F 1/64* (2012.01)
(52) U.S. Cl.
CPC .................................. *G03F 1/64* (2013.01)
USPC ................................. 430/4; 355/75
(58) Field of Classification Search
CPC ........................................................ G03F 1/64
USPC .................. 430/4–5; 156/327, 329
See application file for complete search history.

(56) References Cited

U.S. PATENT DOCUMENTS

| 5,092,492 | A | * | 3/1992 | Centea .......................... 222/137 |
| 5,290,885 | A | * | 3/1994 | Vincent et al. ................ 525/478 |
| 5,691,088 | A | * | 11/1997 | Kubota et al. ..................... 430/5 |
| 2005/0282977 | A1 | * | 12/2005 | Stempel et al. ................ 525/477 |
| 2007/0292775 | A1 | * | 12/2007 | Hamada ............................ 430/5 |

FOREIGN PATENT DOCUMENTS

JP          57100168  A  *  6/1982

OTHER PUBLICATIONS

STIC Translstion of Ishizaki et al. JP-57-100168-A.*

* cited by examiner

*Primary Examiner* — Mark F Huff
*Assistant Examiner* — John S Ruggles
(74) *Attorney, Agent, or Firm* — Manabu Kanesaka

(57) ABSTRACT

There is provided a pellicle having a pellicle frame on which an adhesive layer for attaching the pellicle onto a photo mask is made from a room temperature curable two-part adhesive, so that a formation of the adhesive layer is carried out without heating. The room temperature curable two-part adhesive dispensed on the pellicle frame is not heated for curing.

17 Claims, 2 Drawing Sheets

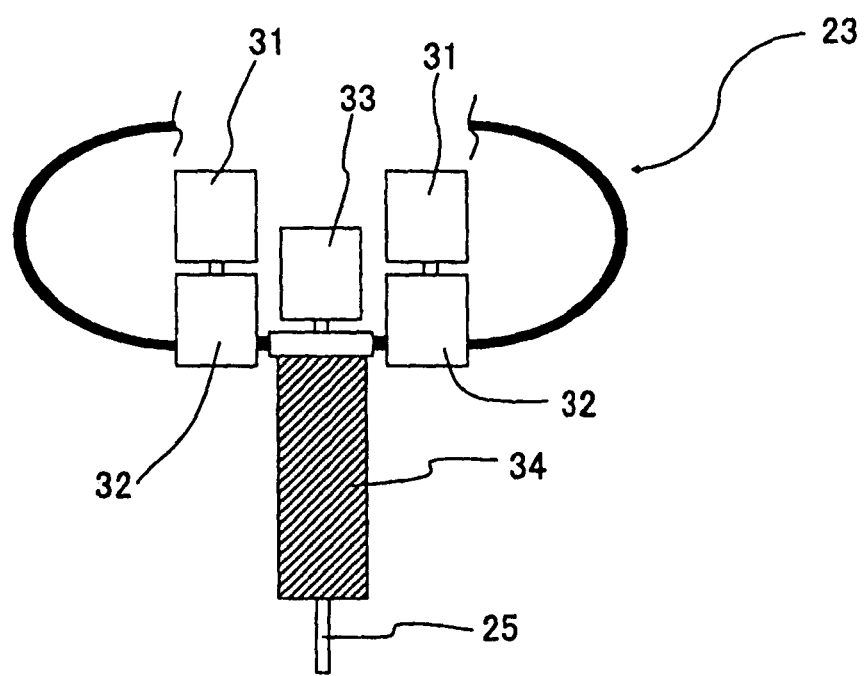

PELLICLE AND A METHOD FOR MAKING THE SAME

RELATED APPLICATIONS

The present application is claims priority from Japanese Application No. 2009-250566, filed Oct. 30, 2009, the disclosure of which is hereby incorporated by reference herein in its entirety.

FIELD OF THE INVENTION

This invention concerns a pellicle used as a dust-fender for masks employed in lithographic printing to manufacture semiconductor devices, printed wiring board, and liquid crystal display board. Also the invention relates to a method for manufacturing such a pellicle which mainly consists of a frame and a transparent membrane pasted on the frame.

TECHNICAL BACKGROUND OF THE INVENTION

In manufacturing semiconductor devices such as LSI and super-LSI or in manufacturing a liquid crystal display board or the like, a pattern is made by irradiating light to a semiconductor wafer or an original plate for liquid crystal, but if a dust gets to adhere to a photo mask or a reticle (hereinafter merely referred to as a "mask" for simplicity) during the irradiation operation, the dust absorbs light or refracts it, causing deformation of a transferred pattern, roughened edges or black stains on a base, and leads to a problem of damaged dimensions, poor quality, deformed appearance and the like.

Thus, these works are usually performed in a clean room, but it is still difficult to keep the mask clean all the time. Therefore, a pellicle is tentatively attached to a surface of the mask as a dust-fender before photo irradiation is carried out. Under such circumstances, foreign substances do not directly adhere to the surface of the mask but only onto the pellicle membrane, which is sufficiently removed from the mask surface, and thus by setting a photo focus on a lithography pattern on the mask, the foreign substances on the pellicle membrane fail to transfer their shadows on the mask and thus no longer become a problem to the image transfer performance.

In general, a pellicle is built up of a pellicle frame, which is an endless frame bar, and a transparent membrane or pellicle film, the latter being tensely pasted to one of two frame faces. The membrane material is selected from cellulose nitrate, cellulose acetate, fluorine-containing polymer and the like, which transmits light well, and the pellicle frame is made of aluminum, stainless, polyethylene or the like. A solvent capable of dissolving the pellicle film is applied to one of two frame faces of the pellicle frame and the pellicle film is laid onto it and the solvent is air-dried to complete the adhesion (Japanese Laid-open Patent Application S58-219023 or 1983-219023), or an adhesive such as acrylic resin, epoxy resin or the like is used to adhere the pellicle film onto the frame face (hereinafter this face is called "upper frame face") (U.S. Pat. No. 4,861,402 and Japanese Pre-Patent Publication for Public Review S63-27707 or 1988-27707). The other frame face (hereinafter called "lower frame face") of the pellicle frame is paved with a pressure-sensitive solid adhesive layer made of polybutene resin, polyvinyl acetate resin, acrylic resin, silicone resin or the like for attaching the pellicle frame to a mask, and over this pressure-sensitive solid adhesive layer is laid a separation layer (or releaser) for protecting the solid adhesive layer. (The applicants failed to find a document dealing with the pressure-sensitive solid adhesive layer from the view point of adhesiveness.)

[Publication-in-patent 1] Japanese Laid-open Patent Application S58-219023
[Publication-in-patent 2] U.S. Pat. No. 4,861,402
[Publication-in-patent 3] Japanese Pre-Patent Publication for Public Review S63-27707

SUMMARY OF THE INVENTION

Problems the Invention Seeks to Solve

Various attempts have been made to shorten the time required for the manufacture of the pellicle. To use a thermosetting resin as the pressure-sensitive solid adhesive layer on the lower frame face is one of the ways contrived to shorten the manufacturing time. However to employ a thermosetting resin necessitates an introduction of a heating device and use of energy for heating, and these lead to an unjustifiably high cost increase. Furthermore, the newly introduced step of heating and curing the adhesive layer has complicated the pellicle production line.

Also, the pressure-sensitive solid adhesive layer is apt to undergo "foaming" during the heating and curing step as the residual infinitesimal bubbles in the solid adhesive layer inflate, which is disadvantageous. When foams occur in the solid adhesive layer, the foams push the solid adhesive layer to expand and this results in the loss of the flatness of the solid adhesive layer. The flatness of the solid adhesive layer is an important element for properly attaching the pellicle to the photo mask; if there is irregularity in the surface of the solid adhesive layer, that part fails to wholly stick to the photo mask, and as a result there may occur a gap between the pellicle and the photo mask. Such a gap allows a dust particle to enter into the interior of the pellicle, whereby the pellicle fails to function as the dust-fender. Thus, the foaming of the solid adhesive layer has been one of the causes for the lowering of the yield rate of the pellicle.

Means to Solve the Problems

This invention concerns a pellicle and a method for manufacturing the same which solve the above-stated disadvantages and problems, and in particular it is characteristic in employing a two-part room-temperature curing adhesive for the pressure-sensitive solid adhesive layer with which the pellicle is attached to the mask whereby no heating is required during this attachment procedure (hereinafter this two-part curing adhesive is referred to as "two-part adhesive"). This two-part adhesive is preferably a kind that contains a silicone resin or an acrylic resin.

Effects of the Invention

According to the invention, it has become possible to simplify the pellicle manufacturing line owing to the absence of the necessity of heating the solid adhesive layer at its curing, and also the energy cost is reduced on account of this heatless step. Furthermore, this rids the phenomenon of foaming, which would otherwise have occurred during the thermal curing of the solid adhesive, so that the yield rate of the pellicle is improved.

BRIEF DESCRIPTION OF THE DRAWINGS

FIG. 3 is a drawing to show the concept of the make of a two-part adhesive mixing and dispensing equipment.

Now, the present invention shall be explained with reference to the drawings; however the invention should be understood to encompass more than what is represented by the drawings. FIG. 1 is a cross-section taken across a plane passing a pair of frame bars perpendicularly thereto to show an example of the pellicle according to the present invention; FIG. 2 is a drawing to show the concept of the make of an adhesive application equipment used in the present invention; FIG. 3 is a drawing to show the concept of the make of a two-part adhesive dispensing equipment.

As shown in FIG. 1, a pellicle 1 is constituted by a pellicle frame 12 having usually a quadrilateral shape (rectangle or square) corresponding to the shape of a base plate (photo mask) to which the pellicle 1 is tentatively attached, a pellicle membrane 11 tensely and permanently bonded to an upper frame face of the pellicle frame 12, and a solid adhesive layer 13 laid on a lower frame face of the pellicle frame 12 for attaching the pellicle 1 to the photo mask. Also over the exposed face of the solid adhesive layer is laid a releaser seal (separator) 14, which protects the solid adhesive layer 13 and is disposed to be peeled off from it.

Figure 1:
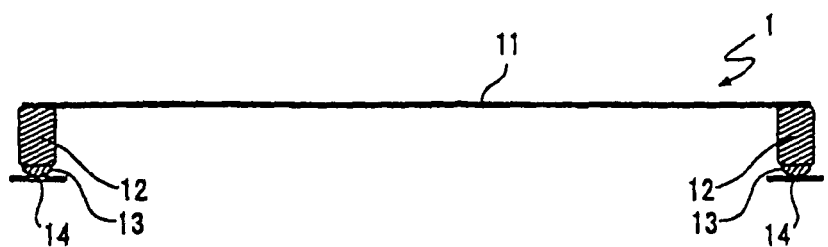
FIG. 1 is a cross-sectional view of an embodiment of the pellicle of the present invention as taken across a plane passing a pair of frame bars perpendicularly thereto.

As for the material to make the pellicle membrane with regard to this invention, there is no particular limit, and any conventionally used material are acceptable. Also there is no particular limit to the material to make the pellicle frame either, so that any conventionally employed metals such as aluminum and stainless steel are acceptable, and so are any conventionally employed synthetic resins such as polyethylene. Furthermore, the pellicle membrane may be bonded onto the pellicle frame in any conventionally known method.

In the present invention the solid adhesive layer is formed from a two-part adhesive. The solid adhesive layer is laid on the lower frame face of the pellicle frame in a manner such that the adhesive layer has a predetermined width (usually equal to or less than the width of pellicle frame bar), and such that the entire track of the lower frame face of the pellicle frame can be seamlessly attached to the base plate.

The two-part adhesive to be employed in the present invention can be any adhesive containing polybutene resin or polyvinyl acetate resin or silicone resin or acrylic resin or the like, and ones containing silicone resin or acrylic resin are practically preferred in that they are excellent in antiweatherability, durability, tackiness, and workability. Workable examples of silicone resin-containing two-part adhesive includes X-40-3122/CAT-PL-50, which is a commercial product made by Shin-Etsu Chemical Co., Ltd. (X-40-3122 is the trade name of the adhesive part and CAT-PL-50 is the trade name of the curing part; hereinafter, this manner of describing two-part adhesive is used.) Other examples of silicone resin-containing adhesive are KR-3700/CAT-PL-50T, X-40-3103/CAT-PL-50T, and KE-1051JA/KE-1051JB, all of these being trade names of Shin-Etsu Chemical Co., Ltd. KE-1051JA/KE-1051JB is a gelled adhesive. As for acrylic resin-containing adhesive, it is possible to use any of SK Dyne series adhesives, such as SK-1425/L45, which are commercialized by Soken Chemical & Engineering Co., Ltd. Among the silicone resin-containing adhesives, X-40-3122/CAT-PL-50T and KE-1051JA/KE1051JB are more favorable because of high adhesive strength and lower content of low molecular siloxane. Among the acrylic resin-containing adhesives, SK-1425/L-45 is more favorable because of high adhesive strength and workability.

The solid adhesive layer can be formed purely of the two-part adhesive, or it can contain one or more additives such as a dye and an oxidation inhibitor, depending on the requirements, so long as such additives do not thwart the purpose of the present invention.

The two-part adhesive used in the present invention is of a type wherein two liquids, consisting of an adhesive part and a curing part, are mixed and cured. As will be described later herein, in a case where the viscosity of the adhesive becomes too high to attain proper fastening to the frame, the adhesive part and the curing part are individually diluted with a solvent before use. Now, the mixing ratio by weight of the adhesive part (or diluted adhesive part) to the curing part (or diluted curing part) is preferably in a range of from [100:110] to [100:1]. When the ratio of the curing part is smaller than one weight part to 100 weight parts of the adhesive part, the magnitude of the measurement error is liable to increase, and there arises a possibility of insufficient mixing of the parts in the dispenser equipment. It is also preferred that the pot life (time required for the reaction to complete) after the mixing of the two liquids is one minute or longer. If the pot life is shorter than one minute, the adhesive becomes prematurely viscous and gelled even during the mixing of the two parts in the dispenser equipment.

Now, the method for applying the two-part adhesive onto the pellicle frame will be explained with reference to FIGS. 2 and 3; however the method can be other than such as explained below.

Figure 2:
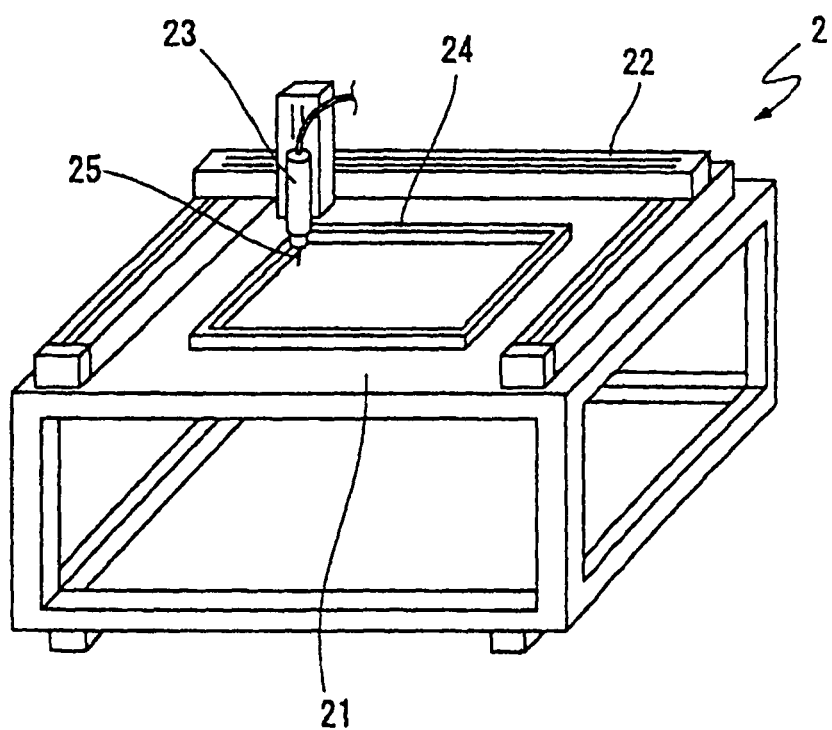
FIG. 2 is a drawing to show the concept of the make of a solid adhesive application equipment.

An adhesive application equipment 2 is shown in FIG. 2. The adhesive application equipment 2 consists of a framed table 21 and a gate-shaped XYZ 3-axis robot 22 having three axes each perpendicular to its neighboring axis, the robot 22 being installed on the framed table 21. The axis Z of the 3-axis robot 22 is equipped with the two-part adhesive dispenser device 23. The pellicle frame 24 is placed on the framed table 21, and it is recommendable to lay a support plate made of a POM resin between the pellicle frame and the frame base so as to prevent the self weight of the pellicle frame 24 from deforming itself 24, thereby maintaining the flatness of the surface of the adhesive.

Controlled from a control panel (not shown), the 3-axis robot 22 is operated to shuffle over the pellicle frame 24, and the two-part adhesive is poured on the pellicle frame 24 from a hollow needle 25 equipped at the end of the two-part adhesive dispensing device whereby the two-part adhesive is applied to the frame 24. In order to obtain a predetermined height for the adhesive layer, the dispensing device may be moved to trace the frame several rounds rather than only one, and in this case it is better to provide an interval of time between each round so as to allow the freshly dispensed adhesive to cure and stabilize before being buried under the newly poured adhesive.

FIG. 3 shows the concept of the make of the two-part adhesive dispenser equipment 23. At the output end of the equipment is provided a dynamic mixer 34, and a motor 33 is linked to the dynamic mixer 34 to rotate the dynamic mixer 34 to thereby mix the adhesive part with the curing part of the two-part adhesive. Stepping motors 31, 31 are designed to activate the respective gear pumps 32, 32 to thereby transport the adhesive part and the curing part of the two-part adhesive from the respective tanks (not shown) to the dynamic mixer 34. The on-off switching and the rotational speed control for the stepping motors 31, 31 are conducted at the control panel (not shown). Accordingly, the adhesive part and the curing part are respectively supplied to the dynamic mixer 34 at controlled supply rates. The hollow needle 25 is provided at the outlet end of the dynamic mixer 34.

As for the transportation means for the adhesive part and the curing part of the two-part adhesive, it is possible to employ any of the kinds known so long as they are capable of controlling the supply rates and lengths of supply times at will; examples include a syringe pump type, a plunger pump type, and a tube pump type as well as a gear pump type, and also a gas jet vacuum pump type employing a gas such as air and nitrogen is possible too.

Furthermore, in a case where the viscosity of the two-part adhesive can become too high for the application equipment to properly carry out the application, it is possible to lower the viscosity of the two-part adhesive through an addition of a solvent to either or both of the adhesive part and the curing part of the two-part adhesive, as needs be, before the application. Such solvent may be an aromatic compound solvent such as toluene and xylene, or an aliphatic compound solvent such as hexane, octane, isooctane and isoparaffin, or a ketonic solvent such as ethyl methyl ketone and methyl isobutyl ketone, or an ester solvent such as ethyl acetate and butyl acetate, or an ether solvent such as diisopropyl ether and 1,4-dioxane. It is also possible to use a mixture of any solvents selected from these.

The separator layer (or release seal), which is for protecting the pressure-sensitive solid adhesive layer until the pellicle is attached to the base plate, will have been removed as of the time the pellicle is in use. Therefore, the release seal is used only where it is necessary to protect the solid adhesive before the pellicle is put to use. The product pellicle is commonly complete with the release seal (separator layer). There is no particular requirement for the release seal, so long as any conventionally used one is adopted. Also the method for applying the release seal onto the pressure-sensitive solid adhesive layer may be any that has been conventionally practiced.

EXAMPLES

Herein below, the present invention shall be explained in detail with reference to the examples and comparative examples, but the examples shall not be construed to limit the scope of the invention.

Example 1

At first, ten rectangular pellicle frames of an aluminum alloy were made by machining, of which the outer periphery measured 782 mm×474 mm, the inner periphery 768 mm×456 mm, and the height 5.0 mm, and of which the corners were rounded to have the inner corner curvature of 2.0 mm radius and the outer corner curvature of 6.0 mm radius. After applying abrasive blasting with SUS beads to a degree of Ra 0.5-1.0, the entire surface of each frame was subjected to a black almite anodization. The pellicle frames were transported into a clean room, where they were washed with a neutral detergent and pure water thoroughly and dried.

Next, each one of the above-mentioned pellicle frames 24 was placed horizontally on the framed table 21 of the adhesive application equipment 2, shown in FIG. 2, in a manner such that the frame face which receives the solid adhesive layer faces upward. In order to prevent the self weight of the pellicle frame 24 from warping the frame 24, and to thereby maintain the flatness of that frame face which receives the solid adhesive layer, a number of supports made of POM resin were positioned underneath the pellicle frame at an interval of about 200 mm along each bar of the pellicle frame 24.

As the two-part adhesive, a silicone resin-containing adhesive X40-3122 (adhesive part), which had been diluted with toluene by 10:3 ratio, and a curing agent CAT-PL-50T (curing part), which had been diluted with toluene by 1:9 ratio, are respectively reserved in the respective tanks of the two-part adhesive dispenser equipment 23. The mixing ratio by mass of the dilute adhesive part to the dilute curing part was set to 100:2.

By means of the apparatus shown in FIG. 2 and FIG. 3, the adhesive part and the curing part are mixed together and the combined two-part adhesive was automatically dispensed. The width of the adhesive layer was made to be 4.0 mm. After drying by air until the adhesive stopped being fluid, the frame was stored carefully in a product stocker to allow the adhesive to cure completely.

Example 2

The same procedures were followed as in Example 1, except that as the two-part adhesive, a silicone resin-containing gelled adhesive KE-1051JA/KE-1051JB (a trade name of Shin-Etsu Chemical Co., Ltd.) was used, and that KE-1051JA (adhesive part) and KE-1051JB (curing part) had not been diluted, and that the mixing ratio by mass between the parts was 100:100.

Example 3

The same procedures were followed as in Example 1, except that as the two-part adhesive, an acrylic resin-containing adhesive SK-1425/L-45 (a trade name of Soken Chemical & Engineering Co., Ltd.) was used, and that SK-1425 (adhesive part) had not been diluted, and that L-45 (curing part) had been diluted with toluene by 1:2 ratio, and that the mixing ratio by mass of the adhesive part to the curing part was 100:1.

Comparative Example 1

To make the pressure-sensitive solid adhesive layer, a silicone resin-containing gelled adhesive KE-1056 (trade name of Shin-Etsu Chemical Co., Ltd.) was used. KE-1056 is an adhesive of one-part type, so that a dispenser for one-part type adhesive was employed for the application of the adhesive on the pellicle frame. Incidentally, KE-1056 is a thermosetting type adhesive, so that it was necessary to program a heat curing step wherein the adhesive layer on the pellicle frame was heated at 130 degrees centigrade for one hour. Furthermore, in some pellicles, it was found that foaming had occurred in the KE-1056 adhesive layer, which is thought to be caused by the heating which inflated the infinitesimal bubbles inherent in KE-1056.

Table 1 shows the results concerning the pellicles of Examples 1-3 and Comparative Example 1 in terms of the rate of foam occurrence in the adhesive layer and also whether the heating was necessary to cure the adhesive.

Incidentally, whether foaming took place or not was visually determined after the adhesive layer was cured. The rate of foam occurrence is calculated as follows.

The rate of foam occurrence (%)=[(number of pellicles of which adhesive layer foamed)/(total number of pellicles tested)]×100

TABLE 1

|  | Example 1 | Example 2 | Example 3 | Comparative Example 1 |
|---|---|---|---|---|
| Heating was necessary to cure Adhesive | no | no | no | yes |
| Rate of Foam Occurrence | 0/10 0% | 0/10 0% | 0/10 0% | 2/10 20% |

[Usefulness in Industry]

The present invention is related to such a pellicle wherein the solid adhesive layer cures without heating so that the pellicle manufacturing process can be simplified and the energy required during the manufacture process can be lowered. Furthermore, the foaming which occurs in the solid adhesive layer during the thermal setting thereof can be avoided, whereby the pellicle yielding rate in the manufacturing process is improved.

What is claimed is:

1. A pellicle, comprising:
   a pellicle membrane,
   a pellicle frame having a first frame face and a second frame face, said pellicle membrane being bonded to the first frame face, and
   a solid adhesive layer which is attached to the second frame face of said pellicle frame,
   wherein said solid adhesive layer is made from a two-part room-temperature curing adhesive including a resin part and a curing composition part, in a manner such that said resin part and said curing composition part are respectively supplied to and mixed in a dynamic mixer, and a resulting mixture is poured on said second frame face of said pellicle frame from a hollow needle equipped at an end of an adhesive dispensing device provided at an outlet end of said dynamic mixer.

2. The pellicle according to claim 1, wherein the resin part contains a silicone resin.

3. The pellicle according to claim 1, wherein the resin part contains an acrylic resin.

4. A method for manufacturing a pellicle, comprising:
   preparing a pellicle membrane, a pellicle frame having a first frame face and a second frame face, said pellicle membrane being bonded to the first frame face, and a solid adhesive layer which is attached to the second frame face of said pellicle frame,
   wherein no heating is applied during a formation of said solid adhesive layer, and
   said solid adhesive layer is made from a two-part room-temperature curing adhesive including a resin part and a curing composition part, in a manner such that said resin part and said curing composition part are respectively supplied to and mixed in a dynamic mixer, and a resulting mixture is poured on said second frame face of said pellicle frame from a hollow needle equipped at an end of an adhesive dispensing device provided at an outlet end of said dynamic mixer.

5. The method according to claim 4, wherein the resin part contains a silicone resin.

6. The method according to claim 4, wherein the resin part contains an acrylic resin.

7. The method according to claim 5, wherein the resin part is an adhesive composition and the curing composition part is a curing composition.

8. The method according to claim 6, wherein the resin part is an adhesive composition and the curing composition part is a curing composition.

9. The method according to claim 7, further comprising mixing the adhesive composition and the curing composition just before the formation of said solid adhesive layer.

10. The method according to claim 8, further comprising mixing the adhesive composition and the curing composition just before the formation of said solid adhesive layer.

11. The method according to claim 5, further comprising adding a solvent to the two-part room-temperature curing adhesive to lower a viscosity of the two-part room-temperature curing adhesive.

12. The method according to claim 6, further comprising adding a solvent to the two-part room-temperature curing adhesive to lower a viscosity of the two-part room-temperature curing adhesive.

13. The method according to claim 4, wherein when the solid adhesive layer is attached to the second frame face of the pellicle frame, the resin part and the curing composition part are transported to the adhesive dispensing device; the resin part and the curing composition part are mixed in the dynamic mixer of the adhesive dispensing device to form the two-part room-temperature curing adhesive; the two-part room-temperature curing adhesive is poured on the second frame face of the pellicle frame from the hollow needle of the adhesive dispensing device while the adhesive dispensing device moves to trace the pellicle frame, to form the solid adhesive layer on the second frame face of the pellicle frame.

14. The method according to claim 13, wherein the adhesive dispensing device moves to trace the pellicle frame several rounds to obtain a predetermined height of the solid adhesive layer.

15. The method according to claim 14, wherein an interval of time is provided to stabilize a dispensed adhesive before pouring a newly poured adhesive.

16. The method according to claim 13, further comprising preparing a separator layer,
   wherein the separator layer is attached to the solid adhesive layer on a side opposite to the second frame face.

17. The method according to claim 16, further comprising removing the separator layer before the pellicle is used for a predetermined use.

* * * * *